United States Patent
Cho et al.

(10) Patent No.: US 9,012,935 B2
(45) Date of Patent: Apr. 21, 2015

(54) VERTICALLY STRUCTURED GROUP III NITRIDE SEMICONDUCTOR LED CHIP AND METHOD FOR MANUFACTURING THE SAME

(71) Applicants: Wavesquare Inc., Yongin, Gyeonggi-Do (KR); Dowa Electronics Materials Co., Ltd., Tokyo (JP)

(72) Inventors: Meoung Whan Cho, Gyeonggi-Do (KR); Seog Woo Lee, Gyeonggi-Do (KR); Pil Guk Jang, Gyeonggi-Do (KR); Ryuichi Toba, Tokyo (JP); Tatsunori Toyota, Toyko (JP); Yoshitaka Kadowaki, Tokyo (JP)

(73) Assignees: Wavesquare Inc., Yongin (KR); Dowa Electronics Materials Co., Ltd., Tokyo (JP)

( * ) Notice: Subject to any disclaimer, the term of this patent is extended or adjusted under 35 U.S.C. 154(b) by 0 days.

(21) Appl. No.: 14/017,889

(22) Filed: Sep. 4, 2013

(65) Prior Publication Data
US 2014/0001511 A1     Jan. 2, 2014

Related U.S. Application Data

(62) Division of application No. 13/503,582, filed as application No. PCT/JP2009/069230 on Nov. 5, 2009.

(51) Int. Cl.
*H01L 33/32*      (2010.01)
*H01L 33/00*      (2010.01)
*H01L 33/62*      (2010.01)

(52) U.S. Cl.
CPC ............ *H01L 33/32* (2013.01); *H01L 33/0079* (2013.01); *H01L 33/62* (2013.01); *H01L 2933/0066* (2013.01); *H01L 2924/0002* (2013.01)

(58) Field of Classification Search
CPC . H01L 33/025; H01L 33/0075; H01L 33/005; H01L 33/48; H01L 33/641; H01L 33/20; H01L 33/38
USPC .................................................. 257/79, 94
See application file for complete search history.

(56) References Cited

U.S. PATENT DOCUMENTS 6,924,210 B1   8/2005   Daubenspeck et al.
2006/0073676 A1   4/2006   Chen et al.
(Continued)

FOREIGN PATENT DOCUMENTS

CN    101120452 A    2/2008
EP    1 798 781 A2    6/2007
(Continued)

OTHER PUBLICATIONS

Jun. 13, 2013 Korean Office Action issued in Korean Patent Application No. 10-2012-7012716 (with translation).
(Continued)

*Primary Examiner* — Whitney T Moore
(74) *Attorney, Agent, or Firm* — Oliff PLC

(57) ABSTRACT

A method for manufacturing vertically structured Group III nitride semiconductor LED chips includes a step of forming a light emitting laminate on a growth substrate; a step of forming a plurality of separate light emitting structures by partially removing the light emitting laminate to partially expose the growth substrate; a step of forming a conductive support on the plurality of light emitting structures; a step of lifting off the growth substrate from the plurality of light emitting structures; and a step of cutting the conductive support thereby singulating a plurality of LED chips each having the light emitting structure. The step of partially removing the light emitting laminate is performed such that each of the plurality of light emitting structures has a top view shape of a circle or a 4n-gon ("n" is a positive integer) having rounded corners.

4 Claims, 10 Drawing Sheets

(56) References Cited

U.S. PATENT DOCUMENTS

| | | |
|---|---|---|
| 2006/0234407 A1 | 10/2006 | Kim et al. |
| 2008/0150087 A1 | 6/2008 | Farooq et al. |
| 2009/0098712 A1 | 4/2009 | Taguchi et al. |
| 2011/0303938 A1 | 12/2011 | Uemura et al. |

FOREIGN PATENT DOCUMENTS

| | | |
|---|---|---|
| JP | A-51-16869 | 2/1976 |
| JP | A-2-240975 | 9/1990 |
| JP | A-8-293476 | 11/1996 |
| JP | A-2000-346648 | 12/2000 |
| JP | A-2001-244503 | 9/2001 |
| JP | A-2002-76435 | 3/2002 |
| JP | A-2005-252222 | 9/2005 |
| JP | A-2006-30329 | 2/2006 |
| JP | A-2006-086469 | 3/2006 |
| JP | A-2006-228855 | 8/2006 |
| JP | A-2006-237339 | 9/2006 |
| JP | A-2006-303429 | 11/2006 |
| JP | A-2009-99681 | 5/2009 |
| KR | 2006-0109378 A | 10/2006 |
| TW | 200620708 A | 6/2006 |
| TW | 200917354 A | 4/2009 |

OTHER PUBLICATIONS

Dec. 8, 2009 International Search Report issued in International Patent Application No. PCT/JP2009/069230 (with translation).
Office Action dated Oct. 18, 2013 issued in U.S. Appl. No. 13/503,582.
Office Action dated Jul. 11, 2014 issued in U.S. Appl. No. 13/503,582.
Office Action dated Mar. 20, 2014 issued in U.S. Appl. No. 13/503,582.
Office Action dated May 6, 2014 issued in Chinese Patent Application No. 200980163264.6 (with translation).
Sep. 4, 2014 extended European Search Report issued in the European Application No. EP09851114.0-1551.
Jul. 23, 2014 Office Action issued in Korean Application No. 10-2012-7012716 (with English translation.).
Sep. 2, 2014 Office Action issued in Japanese Patent Application No. 2011-539246 (with English translation).
Office Action dated Dec. 27, 2013 issued in Korean Patent Application No. 10-2012-7012716 (With English Translation).
Nov. 24, 2014 Notification of Reasons for Refusal issued in Korean Patent Application No. 10-2014-7028765 (with English Translation).
Office Action dated Feb. 5, 2013 issue in Japanese Patent Application No. 2011-539246 (with English Translation).
Office Action dated Jun. 25, 2013 issue in Japanese Patent Application No. 2011-539246 (with English Translation).

FIG. 10
(a)
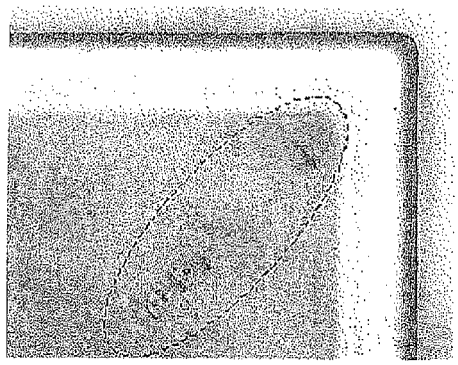
(b)
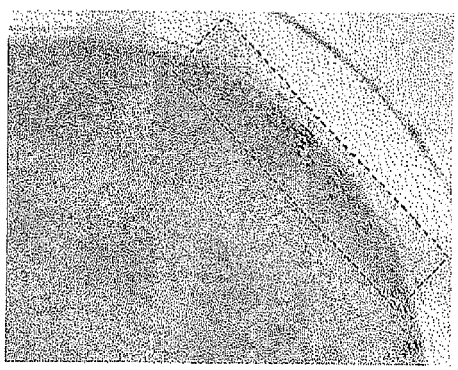
(c)
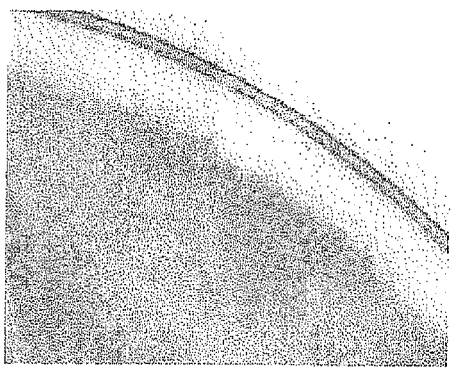
(d)
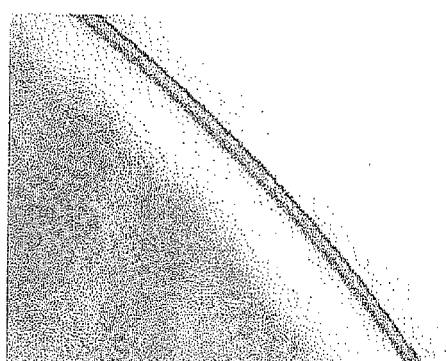
50 μm

VERTICALLY STRUCTURED GROUP III NITRIDE SEMICONDUCTOR LED CHIP AND METHOD FOR MANUFACTURING THE SAME

This is a Divisional Application of application Ser. No. 13/503,582 filed May 30, 2012. The disclosure of the prior application is hereby incorporate by reference herein in its entirety.

TECHNICAL FIELD

The present invention relates to a vertically structured LED chip in which Group III nitride semiconductor layers are stacked, and a method for manufacturing the same.

RELATED ART

In general, Group III-V semiconductors made of compounds of Group III elements and Group V elements are widely used for devices such as light emitting diodes (LEDs).

In manufacturing LEDs of a Group III-V semiconductor such as GaP, GaAs, AlGaAs, or AlInGaP, using Al, Ga, or In as a Group III element and using P or As as a Group V element, the semiconductor is grown on a single crystal substrate made of similar material to the semiconductor for the sake of lattice matching. For example, in cases of epitaxially growing AlGaAs, a GaAs substrate is typically used because AlGaAs is almost lattice matched to GaAs over the entire Al composition range.

In bulk single crystal growth of GaP or GaAs, impurities are added for conductivity control to industrially produce high quality, large diameter (diameter of 2 inches or more), low-cost n-type or p-type conductivity single crystal substrates. A vertical structure can be employed in which the conductive substrate and a light emitting laminate formed by stacking the Group III-V semiconductor layers are sandwiched between a pair of electrodes, and electric current flows in the vertical direction.

On the other hand, a Group III nitride semiconductor using Al, Ga, In, etc. as a Group III element and using N as a Group V element has a high melting point and high nitrogen dissociation pressure, which makes it difficult to perform bulk single crystal growth. Further, since there are no inexpensive large diameter conductive single crystal substrates available, such a semiconductor is typically formed on a sapphire substrate.

However, a sapphire substrate is electrically insulating; accordingly, electric current does not flow in the substrate. Therefore, a lateral structure in which electric current flows in a lateral direction has been conventionally employed. This structure is obtained by partially removing a light emitting laminate formed by sequentially growing an n-type Group III nitride semiconductor layer, an active layer (light emitting layer), and a p-type Group III nitride semiconductor layer on a sapphire substrate to expose the n-type Group III nitride semiconductor layer, and providing an n-type electrode and a p-type electrode on the exposed n-type Group III nitride semiconductor layer and the p-type Group III nitride semiconductor layer, respectively.

In this case, there are four problems as follows. Since the active layer is partially removed, (1) the area of a light emitting portion is reduced. Electric current is necessarily flown in a lateral direction in the n-type thin layer having a thickness of up to about 5 µm, so that series resistance is high to cause (2) increase in the drive voltage and (3) increase in heat generation. Further, since the sapphire substrate has low thermal conductivity, heat generated in the light emitting structure is not sufficiently dissipated, which (4) causes a heat saturation problem in LED characteristics, and is disadvantageous in achieving high output.

In response to this, in recent years, the following techniques for obtaining vertically structured LED chips have been actively studied and developed. After forming a light emitting laminate on a sapphire substrate, the light emitting laminate is supported by a conductive support, and then a sapphire substrate is separated by lift-off The conductive support and the light emitting laminate are sandwiched between a pair of electrodes.

Patent Document 1 (JP 2006-303429A) discloses a technique for making a vertically structured LED chip having its top view shape of a polygon having five or more angles or a circle thereby improving the effect of extracting light through a side surface of the LED chip to prevent deterioration in characteristics of the LED chip due to heat generation and to increase its life.

However, the technique disclosed in Patent Document 1 is considered to limit the effect of extracting light through a side surface to the case of small chip size. In other words, since a light emitting structure layer is typically 5 µm to 10 µm at most, when the chip size is large, the area ratio of the side surface to the entire surface of the light emitting structure is low, and the rate of the light extraction from the chip through the side surface is reduced accordingly.

As an example, not as a vertical structure but as a lateral structure, Example 1 of Patent Document 2 (JP 2002-76435A) describes that when a light emitting structure is processed into a circular cylinder having a radius of 60 µm to 140 µm, the extraction efficiency of light through a side surface tends to be improved thereby increasing the light output as the radius of the circular cylinder, namely, the curvature radius is smaller. This specifically applies only to chips having a small size such as 350 µm or less, and however contradicts in case of the higher output due to increased chip size.

Further, in the technique disclosed in Patent Document 1, a light emitting structure is a light emitting laminate formed from a Group III nitride semiconductor or such a laminate on which a reflective ohmic contact layer is formed all over. Support portions corresponding to individual LED chips are formed of a metal layer by plating; part of the light emitting structure exposed between the chips is removed by dry etching using the metal plate as a mask; and then a sapphire growth substrate is removed by laser lift-off.

If the sapphire substrate is removed with the support portions and the light emitting structures being separated, chips would fall apart; accordingly, subsequent processes such as the manufacturing of an n-type electrode would be complicated and the yield would be reduced.

Support portions of LED chips need to have a thickness of generally 50 µm to about 150 µm for the convenience of handling in post-processes, for example, a mounting process. So, the dimensional accuracy and ensuring the shape of a metal support layer formed by plating are difficult. And, etching of the light emitting structure using the metal support layer formed by plating as a mask makes it difficult to achieve dimensional accuracy and ensuring the shape. Furthermore, since the reflective ohmic metal (ohmic contact layer) is also etched using the mask, metal residue would attach to a side surface of the light emitting laminate; thus, LED chip characteristics would be adversely affected by a short circuit, leakage current, or the like.

PRIOR ART DOCUMENT

Patent Document

[Patent Document 1] JP2006-303429 A
[Patent Document 2] JP2002-76435 A

DISCLOSURE OF THE INVENTION

Problems to be Solved by the Invention

In order to manufacture a nitride semiconductor chip having a vertical structure such as an LED, a laser lift-off process in which an epitaxial layer is separated from a sapphire substrate by laser as described above, a chemical lift-off process in which a metal buffer layer or the like is etched to separate an epitaxial layer from a sapphire substrate, or a photochemical lift-off process is used. Any of the processes is a method for lifting off an epitaxial layer, in which a layer of a material which allows epitaxial growth of a nitride semiconductor is formed on a growth substrate, and after the growth of the nitride semiconductor, the layer is dissolved by laser thermal decomposition or etching to lift-off the epitaxial layer from the growth substrate. This can be described in other words as "the growth substrate is lifted off from the epitaxial layer".

FIGS. 1(a) to 1(c) are diagrams for illustrating vertically structured LED chips of a Group III nitride semiconductor which are obtained by lift-off FIG. 1(a) is a schematic side view of one of singulated LED chips. FIG. 1(b) is a schematic plan view of one of singulated LED chips. FIG. 1(c) is a schematic plan view of a wafer on which a plurality of light emitting structures are formed before singulation into separate LED chips.

As shown in FIG. 1(a), a vertically structured LED chip 200 includes a conductive support portion 202, a light emitting structure 201, and an upper electrode 203 in this order. In general, the conductive support portion 202 and the light emitting structure 201 are formed to have a tetragonal top view shape as shown in FIG. 1(b). This is because when the top view shape of the light emitting structures 201 are tetragon as shown in FIG. 1(c), in cutting a wafer with a plurality of light emitting structures 201 formed thereon into separate LED chips 200, the cutting may be performed rectilinearly in two perpendicular directions as shown by dashed lines in the diagram. Thus, high process productivity is achieved and material loss due to kerf loss can be reduced. Note that in this case, the conductive support portion also serves as a lower electrode.

The present inventors performed a primary isolation by grooving a light emitting laminate made of a Group III nitride semiconductor on a sapphire substrate with a grid pattern by dry etching up to the sapphire substrate, as to form a plurality of separate light emitting structures. Next, a conductive support having the shape of a substrate was formed, and then lift-off was performed to separate the sapphire substrate. Each of the light emitting structures after the lift-off is integrally supported by the conductive support. The separate light emitting structures after the lift-off were found to have considerable rate of cracks formed. The cracks seem to faun when the light emitting structures supported by the conductive support are detached from the sapphire substrate in the lift-off.

FIG. 2 is a top view of the formed cracks observed using an optical microscope. Crack bands are shown to propagate from the vicinity of the corners to the center portion. (This is Conventional example to be shown hereafter in Table 1, and the incidence of cracks was 95.5%.) The product with cracks is deemed to be a defective product, which involves serious problems in terms of yield, cost, and productivity.

The formation of such cracks has not been disclosed in publicly available patent documents, professional literature, or the like partly because it is in the course of study and development. However, it is a critical issue to be solved for achieving mass production of vertical structured Group III nitride semiconductor LED chips.

An object of the present invention is to solve the above problems and to provide high-quality vertical LED chips without cracks in its light emitting structure, and a method for manufacturing the same.

Means for Solving the Problem

In order to achieve the above object, the present invention primarily includes the following components.

(1) A method for manufacturing vertically structured Group III nitride semiconductor LED chips, comprising: a light emitting laminate formation step of forming a light emitting laminate by sequentially stacking a first conductivity type Group III nitride semiconductor layer, a light emitting layer, and a second conductivity type Group III nitride semiconductor layer on a growth substrate, the second conductivity type being different from the first conductivity type; a light emitting structure formation step of forming a plurality of separate light emitting structures by partially removing the light emitting laminate to partially expose the growth substrate; a step of forming an ohmic electrode layer and a connection layer on the plurality of light emitting structures; a step of forming a conductive support which also serves as a lower electrode on the connection layer; a separation step of lifting off the growth substrate from the plurality of light emitting structures; and a cutting step of cutting the conductive support between the light emitting structures thereby singulating a plurality of LED chips each having the light emitting structure supported by a conductive support portion. The light emitting structure formation step includes a step of partially removing the light emitting laminate such that each of the plurality of light emitting structures has a top view shape of a circle or a 4n-gon ("n" is a positive integer) having rounded corners.

(2) The method for manufacturing vertically structured Group III nitride semiconductor LED chips according to (1) above, wherein a plurality of through grooves or through holes penetrating the conductive support are provided in a portion of the conductive support located between the light emitting structures.

(3) The method for manufacturing vertically structured Group III nitride semiconductor LED chips according to (2) above, wherein the cutting step is performed along through the plurality of through grooves or through holes.

(4) The method for manufacturing vertically structured Group III nitride semiconductor LED chips according to (1) or (2) above, wherein the separation step is performed by chemical lift-off or photochemical lift-off.

(5) The method for manufacturing vertically structured Group III nitride semiconductor LED chips according to any one of (1) to (3) above, wherein the separation step is performed by laser lift-off.

(6) The method for manufacturing vertically structured Group III nitride semiconductor LED chips according to any one of (1) to (5) above, wherein the step of forming the conductive support is performed by a bonding method, a wet film formation method, or a dry film formation method.

(7) A vertically structured Group III nitride semiconductor LED chip manufactured by the method according to any one of (1) to (6) above, wherein at least one of a plurality of side surfaces of the conductive support portion is part of a wall of the through groove or the through hole.

(8) A vertically structured Group III nitride semiconductor LED chip comprising: a conductive support portion which also serves as a lower electrode; and a light emitting structure including a second conductivity type Group III nitride semiconductor layer provided on the conductive support portion, a light emitting layer provided on the second conductivity type Group III nitride semiconductor layer, and a first conductivity type Group III nitride semiconductor layer provided on the light emitting layer, the first conductivity type being different from the second conductivity type. The conductive support portion and the light emitting structure are sandwiched between a pair of electrodes. The light emitting structure has a top view shape of a circle or a 4n-gon ("n" is a positive integer) having rounded corners, and the conductive support portion has a top view larger than and different shape from that of the light emitting structure.

(9) The vertically structured Group III nitride semiconductor LED chip according to (7) or (8) above, wherein a length of a straight portion in one side of the 4n-gon having rounded corners: $L_1$ satisfies the following formula:

$$L_1 \leq 0.8L_0,$$

wherein $L_0$ is a length of one side of the 4n-gon with the corners not being rounded.

(10) The vertically structured Group III nitride semiconductor LED chip according to any one of (7) to (9) above, wherein a top view shape of the conductive support portion is an approximately tetragon or octagon shape which is vertically and horizontally symmetrical.

(11) A vertically structured Group III nitride semiconductor LED chip comprising: a conductive support portion which also serves as a lower electrode; and a light emitting structure including a second conductivity type Group III nitride semiconductor layer provided on the conductive support portion, a light emitting layer provided on the second conductivity type Group III nitride semiconductor layer, and a first conductivity type Group III nitride semiconductor layer provided on the light emitting layer, the first conductivity type being different from the second conductivity type. The conductive support portion and the light emitting structure are sandwiched between a pair of electrodes. The light emitting structure has a top view shape of a circle or a 4n-gon ("n" is a positive integer) having rounded corners, and part of side surfaces of the conductive support portion has a cut plane and a non-cut plane having a different surface shape from the cut plane.

(12) The vertically structured Group III nitride semiconductor LED chip according to (11) above, wherein the non-cut plane of the side surfaces of the conductive support portion extends to the top and the bottom of the conductive support portion.

(13) The vertically structured Group III nitride semiconductor LED chip according to (11) or (12) above, wherein the conductive support portion has a tetragonal top view shape as a basic structure, and has recesses on the four sides, the top of each recess being the cut plane.

(14) The vertically structured Group III nitride semiconductor LED chip according to (11) or (12) above, wherein the conductive support portion has an octagonal top view shape as a basic structure, and has cut planes in opposite four sides, and the other opposite four sides are non-cut planes.

Effect of the Invention

In the present invention, a light emitting structure is formed to have a top view shape of a circle or a 4n-gon having rounded corners (n is a positive integer. In other words, 4n means a multiple of 4), to distribute the stress applied to the light emitting structure. Further, a plurality of through grooves or through holes are formed in a conductive support to perform pseudo isolation between the boundaries on the conductive support, which define each light emitting structure. Thus, the stress applied to the light emitting structure from the conductive support side is distributed and the stress applied to each light emitting structure is reduced, which prevents the light emitting structure supported by the conductive support from being cracked when detached from a sapphire substrate at the time of the lift-off. Consequently, incidence of cracks is reduced and high quality vertical LED chips without cracks in the light emitting structure can be provided at a high yield.

In the present invention, a primary isolation of a light emitting laminate made of a Group III nitride semiconductor on the sapphire substrate is performed in accordance with the size of the LED chips to be formed. Since the conductive support still remains as a wafer even after a growth substrate is removed by lift-off, device processing can be performed in post-processes.

BRIEF DESCRIPTION OF THE DRAWINGS

FIGS. 10(a) to 10(d) are photographs each showing a state of cracks formed in a light emitting structure.

BEST MODE FOR CARRYING OUT THE INVENTION

Figure 1:
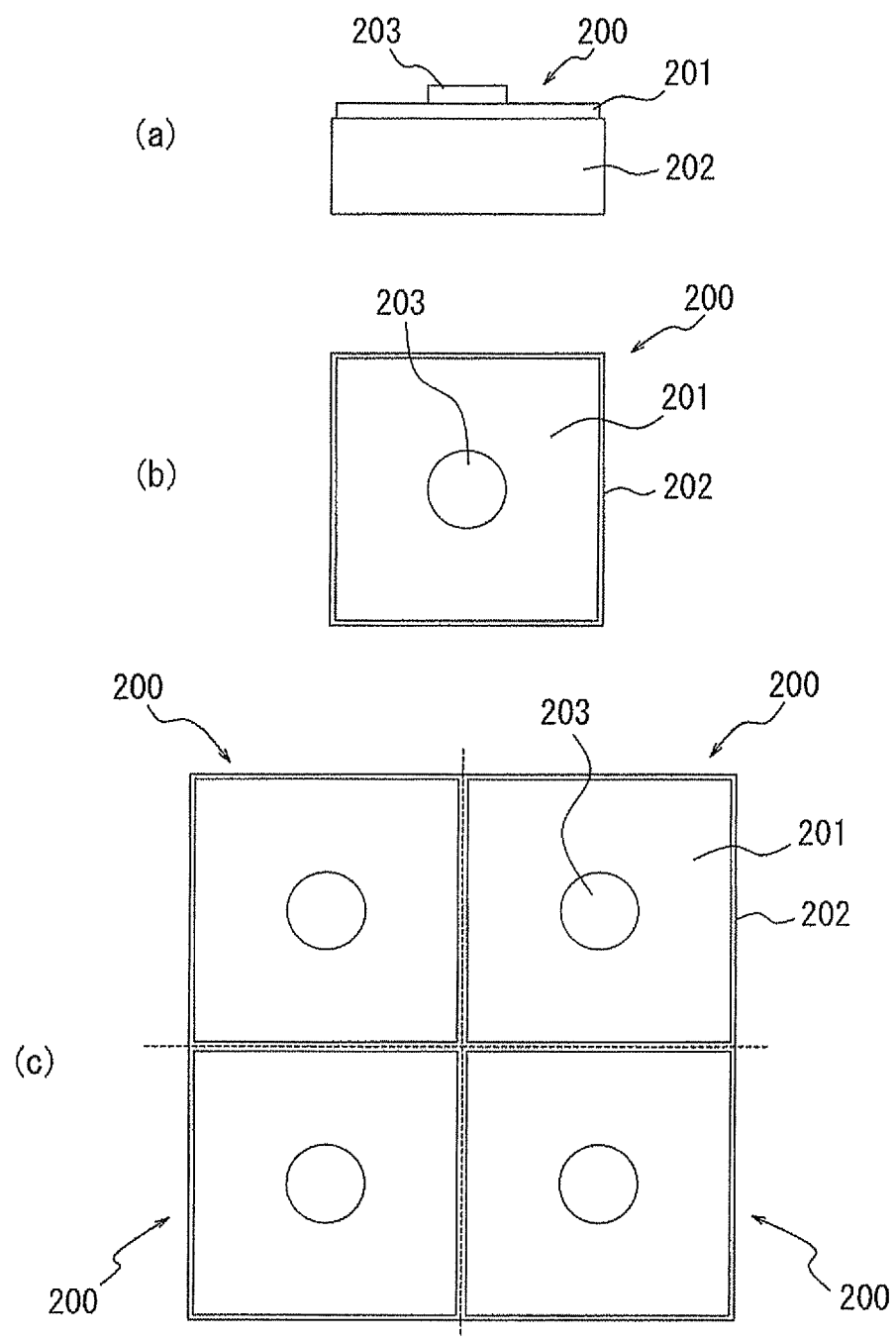
FIG. 1(a) is a schematic side view of one of typical singulated LED chips.
FIG. 1(b) is a schematic plan view of one of the singulated LED chips.
FIG. 1(c) is a plan view of a wafer provided with a plurality of light emitting structures before singulation.

Next, embodiments of a method for manufacturing vertical LEDs in accordance with the present invention will be described with reference to the drawings. FIGS. 3(a) to 3(f) schematically show a flow of a method for manufacturing vertical LEDs in accordance with the present invention. The vertical LEDs in FIGS. 3(a) to 3(f) are enlarged in the thickness direction for the sake of explanation.

A method for manufacturing vertical LEDs in accordance with the present invention includes, as shown in FIGS. 3(a) to 3(f), a light emitting laminate formation step (FIG. 3(a)) of forming a light emitting laminate 105 by sequentially stacking a first conductivity type Group III nitride semiconductor layer 102, a light emitting layer 103, and a second conductivity type Group III nitride semiconductor layer 104 having a different conductivity type from the first conductivity type on a growth substrate 101; a light emitting structure formation step (FIG. 3(b)) of forming a plurality of separate light emitting structures 106, for example isolated like islands by partially removing the light emitting laminate 105 to partially expose the growth substrate 101; a step of forming a conductive support 107 also serving as a lower electrode on the plurality of light emitting structures 106 (FIG. 3(c)); a separation step of lifting off the growth substrate 101 from the plurality of light emitting structures 106 (FIG. 3(d)); and a cutting step of cutting the conductive support 107 between the light emitting structures 106 into conductive support portions 107a (FIG. 3(f)) to perform singulation of a plurality of LED chips 100 each having a light emitting structure 106. Note that as shown in FIG. 3(e), another step of forming an upper electrode 108 on the separation side of the light emitting structure may be added after the separation step.

Figure 2:
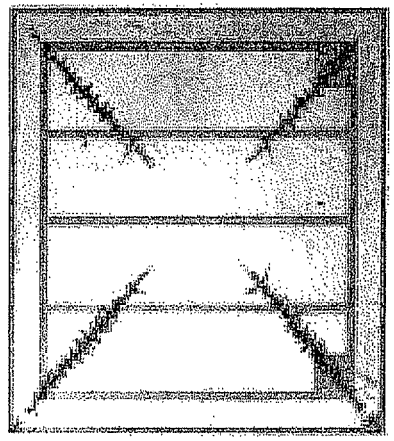
FIG. 2 is a photograph showing a state of cracks formed in a conventional light emitting structure.
Figure 3:
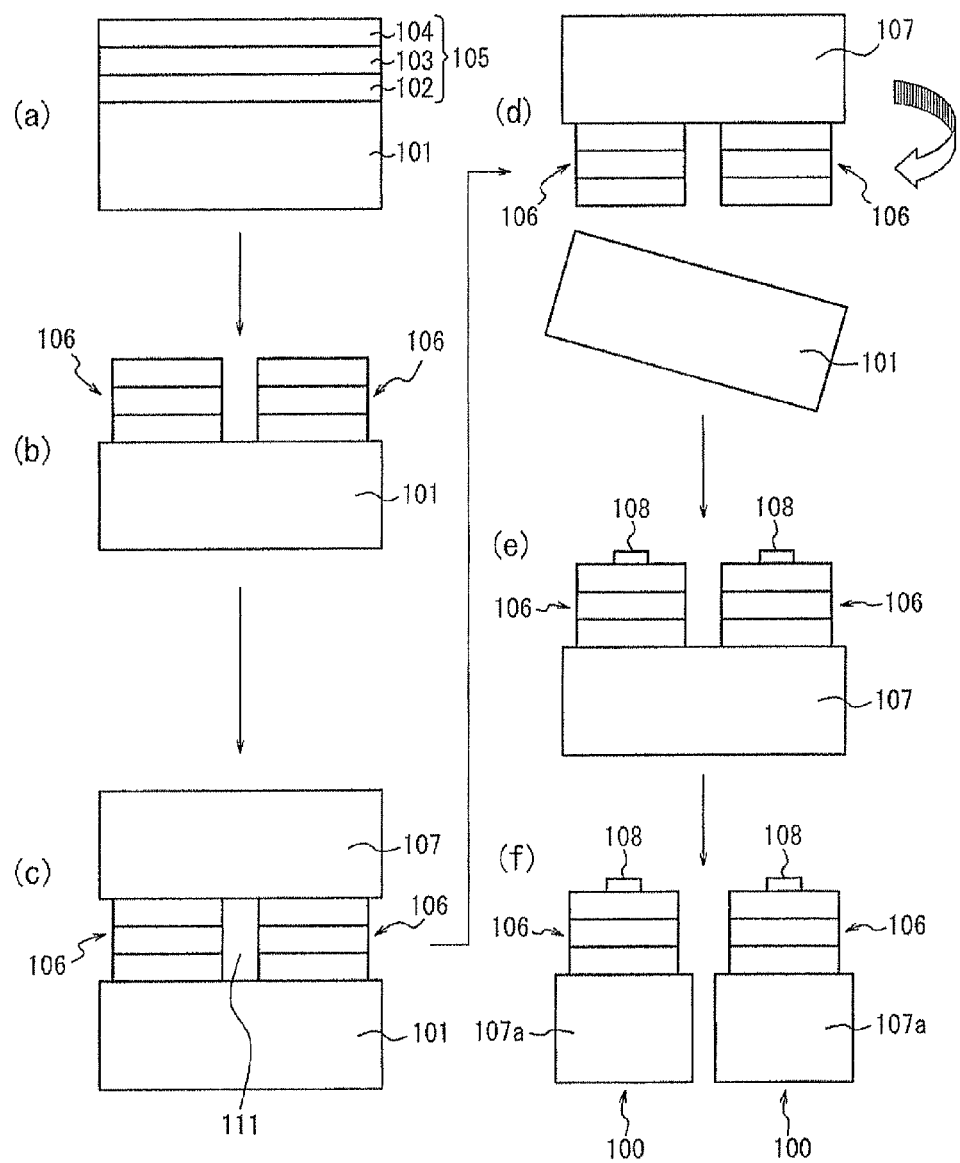
FIGS. 3(a) to 3(f) schematically illustrate a flow of a method for manufacturing vertical LED chips according to the present invention.

The present inventors formed a vertical LED 200 including a light emitting structure having a square top view shape as shown in FIG. 1(b) in order to observe cracks formed in the light emitting structure, to find many cracks in the light emitting structure 201 as shown in FIG. 2. These cracks are shown to propagate from the vicinity of the corners of the light emitting structure 201 to the center part. Note that FIG. 2 shows a light emitting structure having a square top view shape of which one side has a length of 1000 which were observed using an optical microscope. Such cracks propagating to the center part are formed significantly in light emitting structures of large size chips having a side of 500 μm or more in length.

The present inventors have made various studies on the formation of such cracks to ascertain that the cracks are formed depending on the shapes of light emitting structures or conductive support portions rather than depending on the crystallographic slip planes or cleavage planes. They found that many cracks were formed particularly in the vicinity of the corners of the light emitting structures. This is considered to be associated with distribution of stresses, such as the stresses among the growth substrate and the light emitting structures and connected conductive support portions, that concentrate at the vicinity of the corners in the light emitting structures when the growth substrate is separated from the light emitting structures.

Figure 4:
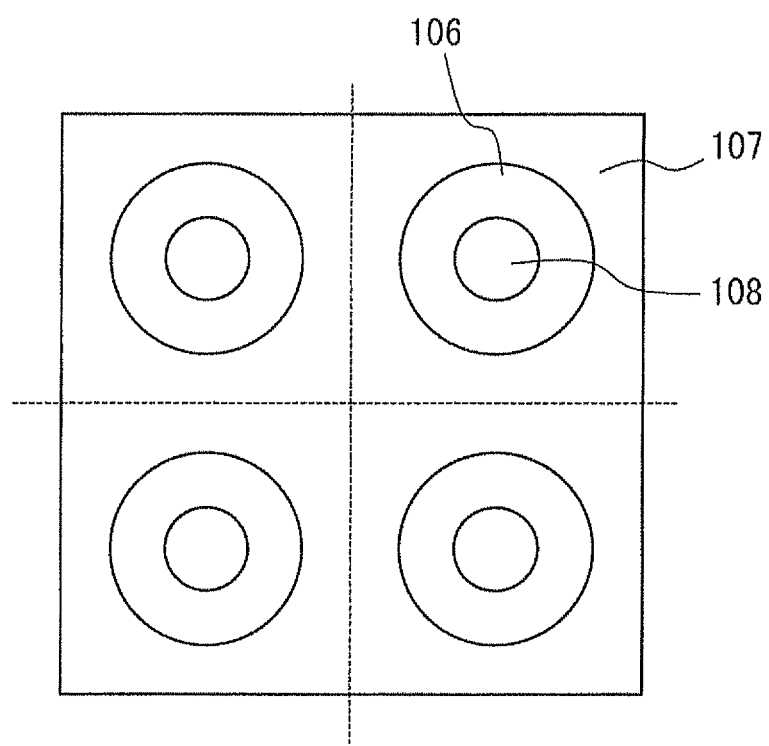
FIG. 4 shows a schematic plan view of a wafer before singulation of vertical LEDs in accordance with the present invention.

In view of the above, the light emitting structure formation step (FIG. 3(b)) of the method for manufacturing vertical LED chips in accordance with the present invention includes partially removing the light emitting laminate 105 so that each of the plurality of light emitting structures 106 has a top view shape of a circle or a 4n-gon ("n" is a positive integer) having rounded corners as shown in FIG. 4. With such a structure, stress concentration at the light emitting structures 106 is precluded, and high quality vertical. LED chips without cracks can be provided.

Further, in the conductive support formation step (FIG. 3(c)) of the method for manufacturing vertical LED chips in accordance with the present invention, a portion of the conductive support located between the light emitting structures is provided with a plurality of through grooves or through holes which penetrate the conductive support. Thus, the stress applied to each of the light emitting structures from the conductive support side is distributed, and stress concentration at the vicinity of the corners of the light emitting structures 106 is avoided. Therefore, high quality vertical LED chips without cracks can be provided.

A sapphire substrate or an AlN template substrate in which an AlN film is fanned on a sapphire substrate is preferably used as the growth substrate 101. The selection may be made depending on the kind of a lift-off layer to be formed, the composition of Al, Ga, and In of the light emitting laminate made of a Group III nitride semiconductor, the quality of LED chips, cost, and the like.

A GaN buffer layer is preferable as a lift-off layer in cases of employing laser lift-off in that it can be thermally decomposed by laser and prevented from reattaching thereafter (since the melting point of Ga is low as 29.7° C.), while a metal buffer layer of CrN or the like is preferable as a lift-off layer in cases of employing chemical lift-off in that it can be dissolved by selective chemical etching. The GaN buffer layer is preferably formed in an MOCVD apparatus described below, and the metal buffer layer is preferably formed by sputtering, vacuum vapor deposition, ion plating, or MOCVD.

The first conductivity type and the second conductivity type of the light emitting laminate 105 may be n-type and p-type, respectively or opposite thereto. The first conductivity type Group III nitride semiconductor layer 102, the light emitting layer 103, and the second conductivity type Group III nitride semiconductor layer 104 can be epitaxially grown on the growth substrate 101, for example by MOCVD.

The light emitting structures 106 manufactured by a method for manufacturing vertical LED chips in accordance with the present invention has a top view shape of a circle or a 4n-gon ("n" is a positive integer) having rounded corners. Therefore, when the conductive support 107 is assumed to be cut along orthogonal lines as shown by dashed lines in FIG. 4, the circle or the 4n-gon ("n" is a positive integer) having rounded corners can be located symmetrically; thus, the applied stress can be distributed uniformly. Further, a vertical cross section of each light emitting structure 106 has rounded corners, which distributes the stress applied to the light emitting structures 106 when the light emitting structures 106 are separated from the growth substrate 101 to be transferred onto the conductive support 107, so that the formation of cracks can be further suppressed.

In the above-described light emitting structure formation step, part of the light emitting laminate 105 is preferably removed by dry etching. This is because end points of etching of the light emitting laminate 105 made of a Group III nitride semiconductor layer can be reproducibly controlled. Further, in cases where adjacent light emitting structures 106 connect, when the growth substrate 101 is separated, for example by laser lift-off, there is no escape for nitrogen gas generated by thermal decomposition of the above GaN layer and the like, which results in cracks or rupture in the light emitting structures 106. Further in that case, when the above-described chemical lift-off or photochemical lift-off by which the metal buffer layer is dissolved with a chemical etchant is used, the etchant is not supplied to the metal layer. Thus, lift-off cannot be carried out. Therefore, the removal of part of the light emitting laminate 105 is performed to expose part of the growth substrate 101.

Although not shown in the drawings, in the above support formation step, an ohmic electrode layer and a connection layer are preferably formed between the plurality of light emitting structures 106 and the conductive support 107 such that the ohmic electrode layer contacts each of the plurality of light emitting structures 106 and the connection layer contacts the conductive support 107. Further, an additional reflection layer is more preferably formed between the ohmic electrode layer and the connection layer; alternatively, the ohmic electrode layer preferably also serves as a reflection layer. These layers can be formed by a dry film formation method such as vacuum vapor deposition, ion plating, or sputtering.

The foregoing ohmic electrode layer can be formed of a high work function metal, for example, a noble metal such as Pd, Pt, Rh, or Au; or Co or Ni.

The above ohmic electrode layer can be used also as a reflection layer since Rh and the like have high reflectivity. However, when the emission wavelengths are in the range of green to blue, a layer of Ag, Al, or the like is preferably used. Meanwhile, when the emission wavelengths are in an ultraviolet range, a layer of Rh, Ru, or the like is preferably used.

Further, the kind of the connection layer depends on the forming method of the conductive support 107. When the conductive support 107 is bonded to the connection layer by a bonding method such as thermocompression bonding, the connection layer can be made of Au, Au—Sn, solder, or the like.

Note that the conductive support 107 is preferably a conductive silicon substrate, a CuW alloy substrate, a Mo substrate, or the like since they are suitable in terms of the thermal expansion coefficient and thermal conductivity. Further, the conductive support 107 may be formed by wet or dry plating. For example, Cu or Au electroplating is employed; Cu, Au, or the like can be used as the connection layer.

The conductive support portion 107a viewed from above preferably has a top view larger than that of the light emitting structure 106, so that 50 μm or more of the end portion of the conductive support portion 107a is exposed. Further, a vertical cross section of the conductive support portion 107a preferably has a tetragonal or octagonal shape as a basic structure. The term "as a basic structure" here means that the conductive support portion after dicing may have depressions or protrusions on its sides or its corner portions and means that holes or grooves may be formed in the conductive support 107 before dicing.

More specifically, as shown in examples of FIG. 5(a) and FIG. 6(a), a plurality of through grooves 109 or through holes 110 penetrating the conductive support 107 are preferably provided in a portion of the conductive support 107 located between the light emitting structures 106. The holes or grooves are provided in the conductive support, so that pseudo isolation is performed between the boundaries on the conductive support defining each light emitting structure. Thus, the stress applied to the light emitting structures from the conductive support portion side can be alleviated and distributed.

When the metal layer is lifted off by being dissolved by chemical lift-off or photochemical lift-off using a chemical etchant, the etchant can be supplied and drained effectively by forming the through grooves 109 or the through holes 110 in the conductive support 107 in addition to grooves 111 (etch channels) between the light emitting structures 106. Thus, the etching rate of the metal layer can be improved, which is a secondary effect.

Note that the through grooves 109 or the through holes 110 in the above conductive support 107 are formed by dry etching when a Si substrate is used as the conductive support 107, while the grooves or the holes are formed using a mask of a thick photoresist film when the conductive support 107 is made by Cu or Au plating. It is naturally preferable that the grooves or the holes and the separation grooves between the light emitting structures 106 are facing each other. When the through grooves 109 or the through holes 110 are positioned under the light emitting structures 106, stress distribution becomes nonuniform, which would promote crack formation and damage the conductive support portion to impair heat dissipation.

In the above separation step, the lift-off layer is preferably removed by laser lift-off, chemical lift-off, or photochemical lift-off to perform separation between the growth substrate 101 and the light emitting structures 106.

Further, surfaces of the light emitting structures 106 that have been exposed by the separation step are preferably cleaned by wet washing. Then, a given thickness of the surfaces is trimmed by dry etching and/or wet etching, and an n-type ohmic electrode and a bonding pad electrode are formed by lift-off using a resist as a mask. Al, Cr, Ti, Ni, Pt, Au, or the like is used as an electrode material. Pt, Au, or the like is deposited as a cover layer on the ohmic electrode and the bonding pad to reduce wiring resistance and improve adhesion of the wire bonding. Note that the side surfaces and surfaces of the light emitting structures 106 may be provided with a protective film made of $SiO_2$, SiN, or the like.

In the above cutting step, cutting is performed between the light emitting structures 106 using, for example, a dicing blade or a laser dicer. In order to prevent heat or crushing damage on the light emitting structures 106, the light emitting structures 106 are generally put inside the periphery of each conductive support portion 107a, with a typical margin of about 10 μm to 30 μm.

Further, the cutting step is preferably performed along through the plurality of through grooves 109 or through holes 110. In other words, with respect to vertical LEDs of the present invention, at least one of a plurality of side surfaces of the conductive support portion can be part of a wall of the through groove 109 or the through hole 110 by means of the above-described method for manufacturing vertical LEDs. FIG. 5(b) and FIG. 6(b) each show a schematic side view of vertical LEDs after the cutting step. The hatching in the conductive support portion 107 shows a cut portion and the rest shows part of the walls of the above through grooves 109 or through holes 110.

That is to say, the division plane after dicing constitutes part of the conductive support portion, and part of side surfaces of the conductive support portion in a chip preferably have a non-cut plane which is not a cut plane. Here, the "cut plane" refers to a plane along which cutting is directly performed using a dicer or the like in the cutting step. For example, when the conductive support 107 is cut along through the above through grooves or through holes, planes corresponding to the walls of these through grooves or through holes are non-cut planes which have not been touched by a blade or exposed to laser. Therefore, such non-cut planes and the above mentioned cut planes have different surface shapes each other.

The cut planes are blade-cut planes or laser-melted planes. The non-cut planes are dry etched planes or planes left after removing resist masks. The non-cut planes would be subjected to an etchant, for example, in chemical lift-off or in the formation of the electrodes. Although the difference of surface conditions between the cut planes and the non-cut planes is difficult to define with roughness and the like but can be observed using an optical microscope or the like.

Next, embodiments of vertical LEDs in accordance with the present invention will be described with reference to the drawings.

Vertical LEDs in accordance with the present invention, as an example shown in FIG. 4, comprises a conductive support portion 107a and a light emitting structure 106 including a second conductivity type Group III nitride semiconductor layer provided on the conductive support portion 107a, a light emitting layer provided on the second conductivity type Group III nitride semiconductor layer, and a first conductivity type Group III nitride semiconductor layer provided on the light emitting layer, the first conductivity type being different from the second conductivity type. The conductive support portion 107a and the light emitting structure 106 are sandwiched between a pair of electrodes. Further, the light emitting structure 106 has a top view of a circle or a 4n-gon ("n" is a positive integer) having rounded corners, and the conductive support portion 107a has a top view larger than and different shape from that of the light emitting structure 106. With such a structure, high quality vertical LEDs with less cracks in the light emitting structures 106 can be provided.

Note that the drawings and the following description are based on a circle or a regular 4n-gon, which has equal height and width for convenience; however, similar effects can be achieved even if the height and the width have different lengths. In cases of using an ellipse, a rectangle, or the like, the height and the width should satisfy the conditions below without exceeding the aspect ratio of 3:1.

The length of a straight portion in one side of the 4n-gon having rounded corners $L_1$ preferably satisfies the following formula:

$$L_1 \leq 0.8 L_0,$$

wherein $L_0$ is a length of one side of the 4n-gon with the coroners not being rounded.

Here, the rounded corners in the present invention are preferably circular arcs having a curvature radius of R. The lower limit of R required for suppressing cracks depends on the chip size or the structures of the growth substrate, the buffer layer, the light emitting structures, and the conductive support portions of the LEDs. In the present invention, the corners are rounded by design so that the rounding exceeds the roundness range formed by the general beveling amount on a photomask or the bluntness caused at the corner portions in a photolithography process.

In a case where an n-gon is inscribed in a square having a side length of W, when the length $L_0$ of the side of the polygon is as follows:

$$L_0 = W \times \tan(180°/N).$$

When the circular arc of a rounded corner having a curvature radius of R is inscribed to the sides meeting at a corner of the n-gon, the length of a side after beveling (straight portion) $L_1$ is as follows:

$$iL_1 = L_0 - 2 \times R / \tan((180° - 360°/N)/2).$$

The ratio of $L_1$ to $L_0$: $L_1/L_0$ is as follows:

$$L_1/L_0 = 1 - 2 \times R/W / \tan((180° - 360°/N)2)/\tan(180°/N)$$

$$= 1 - 2 \times R/W / \tan(90° - 180°/N)/\tan(180°/N)$$

$$= 1 - 2 \times R/W.$$

Thus, the ratio depends on W and R, and is not dependent on N.

In the present invention, the ratio of length $L_0$ of one side the polygon before beveling to the length $L_1$ of the straight portion in a side after beveling: $L_1/L_0$ is preferably 0.8 or less, more preferably 0.7 or less, so that crack formation can be significantly suppressed.

Further, a top view of the conductive support portion 107a is preferably larger than that of the light emitting structure 106, and 50 μm or more of the end portion of the conductive support portion 107a is preferably exposed. Furthermore, the top view shape of the conductive support portion 107a preferably has a tetragonal or octagonal shape as a basic structure. The term "as a basic structure" here means that the conductive support portion 107a after the cutting step may have depressions or protrusions on its sides or its corner portions and means that the through grooves 109 or the through holes 110 may be formed in the conductive support 107 before the cutting step. The through groove 109 or the through holes 110 are provided in the conductive support 107, so that the through groove 109 or the through holes 110 in the conductive support 107 alleviate the stress applied to the light emitting structures, which contributes to the prevention of crack formation.

Note that FIGS. 1 to 6 show examples of alternative embodiments, and the present invention is not limited to these embodiments.

EXAMPLE

Experimental Examples 1 to 8

In Experimental Examples 1 to 8, a lift-off layer (CrN layer, thickness: 18 nm) was formed on a sapphire substrate, and then an n-type Group III nitride semiconductor layer (GaN layer, thickness: 7 μm), a light emitting layer (InGaN-based MQW layer, thickness: 0.1 μm), and a p-type Group III nitride semiconductor layer (GaN layer, thickness: 0.2 μm) were sequentially stacked to form a light emitting laminate. Subsequently, the light emitting laminate was partially removed to partially expose the sapphire substrate. Thus, a plurality of light emitting structures isolated like islands were formed such that the light emitting structures have a vertical cross section of a square, a square having rounded corners, or a circle. Table 1 shows the length $L_0$ of a side of the square before rounding the corners, the curvature radius R, the length $L_1$ of a straight portion in a side after the rounding, and the ratio of $L_1$ to $L_0$: $L_1/L_0$.

An ohmic electrode layer (Rh, thickness: 0.1 μm) and a connection layer (Au—Sn alloy, thickness: 1.5 μm) were formed on the light emitting structures. Ohmic contacts of Ti/Pt were formed on both surfaces of a boron-doped p-type conductive silicon substrate to be bonded to the light emitting structures. Further, another connection layer (Au—Sn alloy layer, thickness: 1.0 μm) was formed on the silicon substrate on the side to be bonded to the above light emitting structures. Then the bonding was performed by hot press.

After that, the sapphire substrate was separated by chemical lift-off. Note that diammonium cerium(IV) nitrate solution was used as an etchant. This solution is suitable because it can etch only the lift-off layer without corroding the silicon substrate and the above metal layers.

Experimental Examples 9 to 14

The sapphire substrate was separated by a similar method to the above Experimental Examples except for that the light emitting laminate was partially removed to form a plurality of light emitting structures isolated like islands such that the light emitting structures have a vertical cross-sectional shape of a regular octagon, a regular octagon having rounded corners, or a circle.

Experimental Examples 15 to 22

The sapphire substrate was separated by a similar method to the above Experimental Examples except for that the light emitting laminate was partially removed to form a plurality of light emitting structures isolated like islands such that the light emitting structures have a vertical cross-sectional shape of a regular dodecagon, a regular dodecagon having rounded corners, or a circle.

Conventional Example and Experimental Examples 23 to 25

A light emitting laminate was partially removed to form a plurality of light emitting structures isolated like islands such that the light emitting structures have a vertical cross-sectional shape of a square (Conventional Example) or a circle. The width W of the light emitting structures was 1000 μm. Table 1 shows the length $L_0$ of a side of the square before rounding the corners, the curvature radius R, the length $L_1$ of a straight portion in a side after the rounding, and the ratio of $L_1$ to $L_0$:$L_1/L_0$. The devices were individually disposed inside the cells in a grid. The pitch between the devices is 1250 μm.

Figure 5:
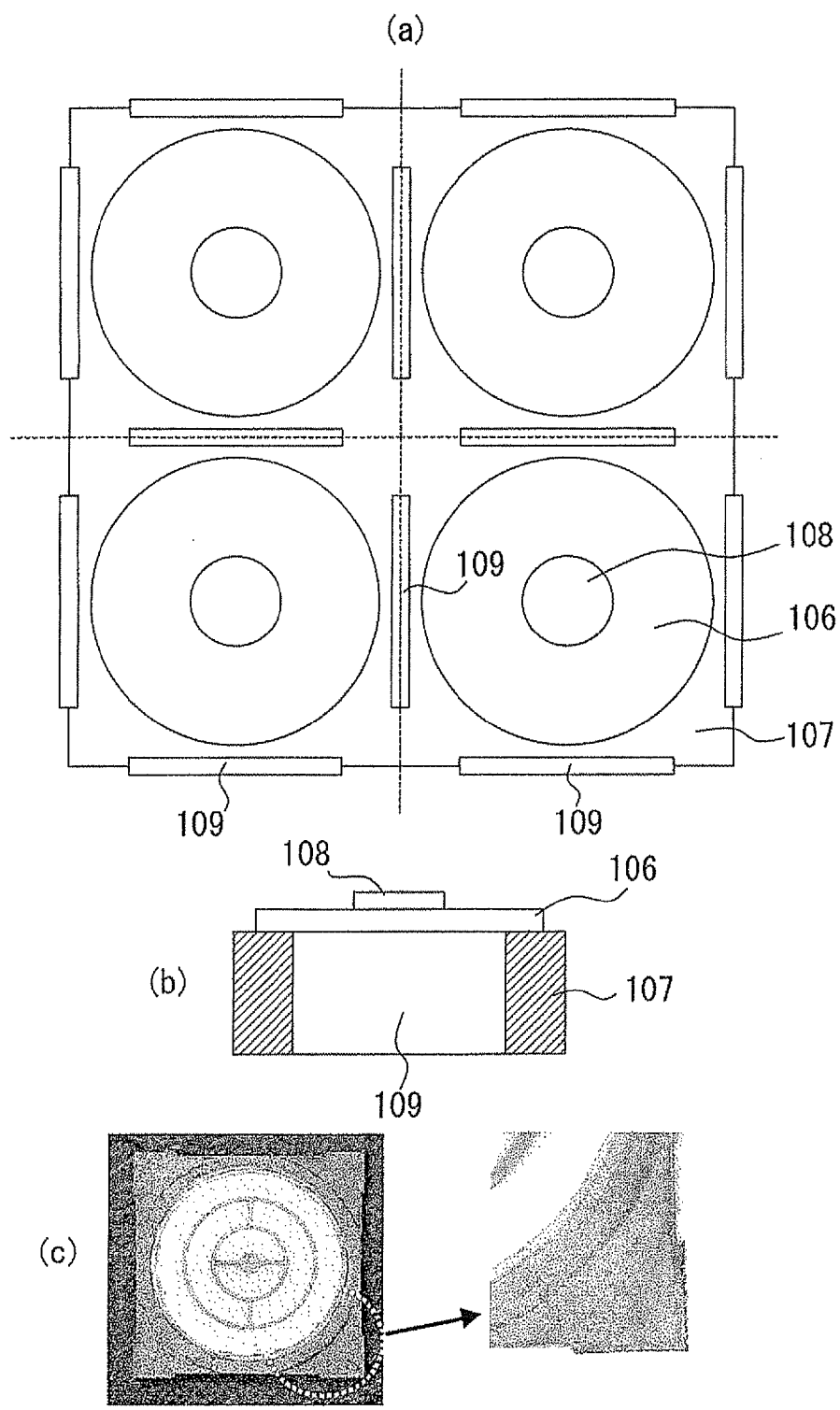
FIG. 5(a) is a schematic plan view of a wafer before singulation of vertical LED chips in accordance with the present invention.
FIG. 5(b) is a schematic side view of a vertical LED chip after singulation according to the present invention.
FIG. 5(c) is a photograph of an actual vertical LED chip viewed from above.
Figure 6:
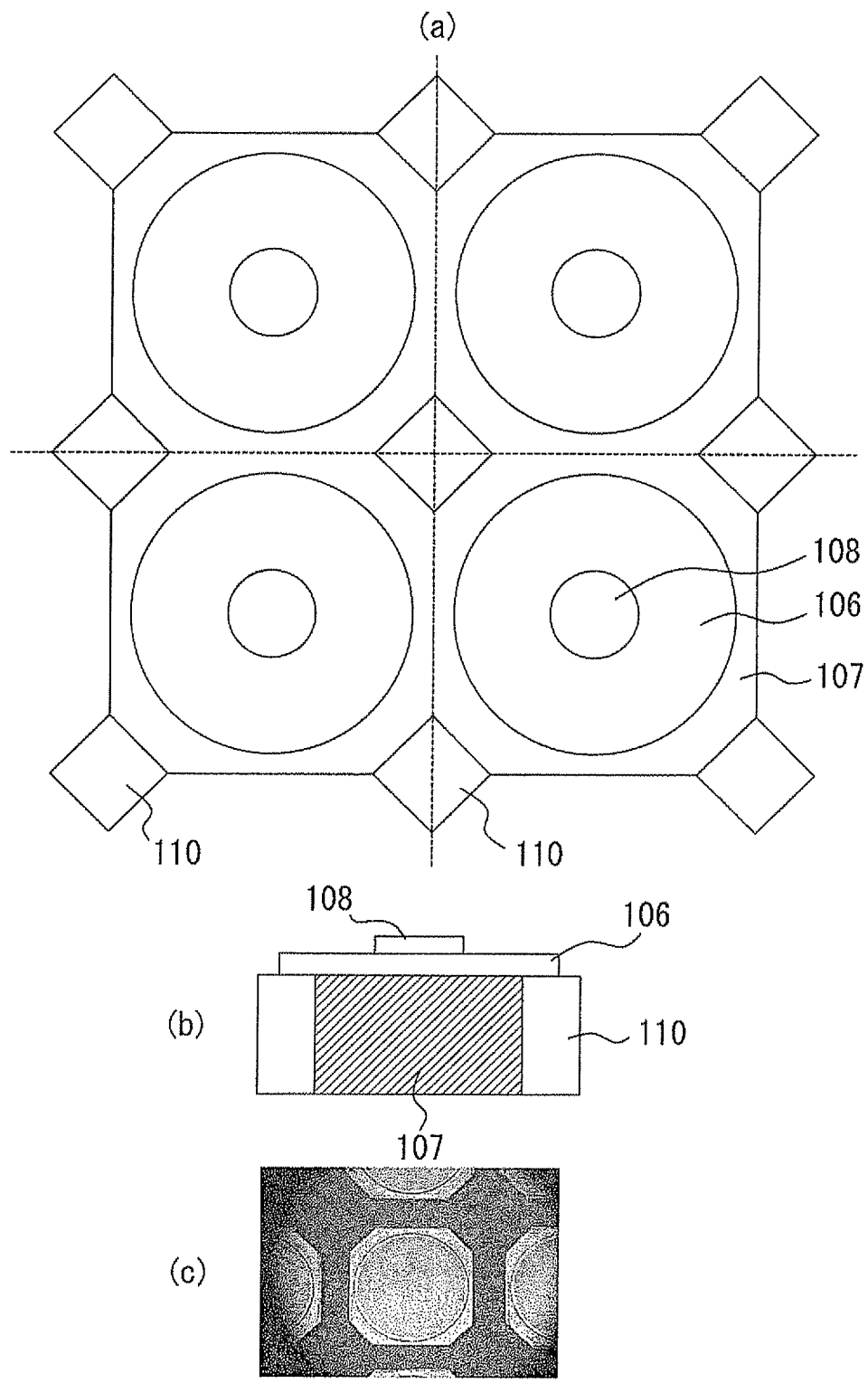
FIG. 6(a) is a schematic plan view of a wafer before singulation of vertical LED chips in accordance with the present invention.
FIG. 6(b) is a schematic side view of a vertical LED chip after singulation according to the present invention.
FIG. 6(c) is a photograph of an actual vertical LED chip viewed from above.

In Experimental Examples 24 and 25, an ohmic electrode layer (NiO and Ag) was formed on the p-layers of each light emitting structure. Then, photoresists were embedded in the division grooves while a p-ohmic electrode layer portion of each light emitting structure was opened, and a connection layer (Ni/Au/Cu) was formed. Next, pillars were formed using thick film resists in order to prevent film formation at the time of Cu plating to be described later. The pillars are formed on the grid lines surrounding each light emitting structure as shown in FIG. 5(*a*) or at the points where the lines intersect as shown in FIG. 6(*a*). Note that portions of the connection layer on the pillar formation areas were previously removed by etching.

Next, electroplating with Cu was performed using a copper sulfate-based electrolyte solution to form a 80 μm conductive support. The solution temperature was in the range of 25° C. to 30° C., and the deposition rate was 25 μm/hr. Then, the pillar portions and the resists embedded in the division grooves were removed by chemical cleaning, and grooves or holes penetrating the conductive support were formed. Note that the through grooves 109 shown in FIG. 5(*a*) were formed to have four sides with a width of 70 μm and a length of 900 μm. The through holes 110 shown in FIG. 6(*a*) were each shaped into a rectangular prism having a length of 410 μm on a side. After that, the metal layer was dissolved and removed using a selective etchant to separate the growth sapphire substrate, and the light emitting structures were transferred to the conductive support. Note that in Conventional Example and Experimental Example 23, Cu plating was performed on the entire surface without forming additional pillars and without removing the connection layer on the pillar portions.

(Evaluation)

In Experimental Examples 1 to 22, the surfaces of the light emitting structures exposed by separating the sapphire substrate from the light emitting structures were observed using an optical microscope, to examine the state of crack formation and crack incidence in the wafer surface. The state where cracks propagated from the corner portions to the chip center as shown in FIG. 10(*a*) and the state where cracks were formed in the vicinity of the corner portions as shown in FIG. 10(*b*) were specific features, and no cracks were formed on straight portions in the sides. The incidence of the cracks from the corner portions to the chip center and the cracks in the vicinity of the corner portions are shown in Table 1 and FIGS. 7 to 9. Note that FIG. 7 shows the results of Experimental Examples 1 to 8, FIG. 8 show the results of Experimental Examples 9 to 14, and FIG. 9 shows the results of Experimental Examples 15 to 22.

Figure 7:
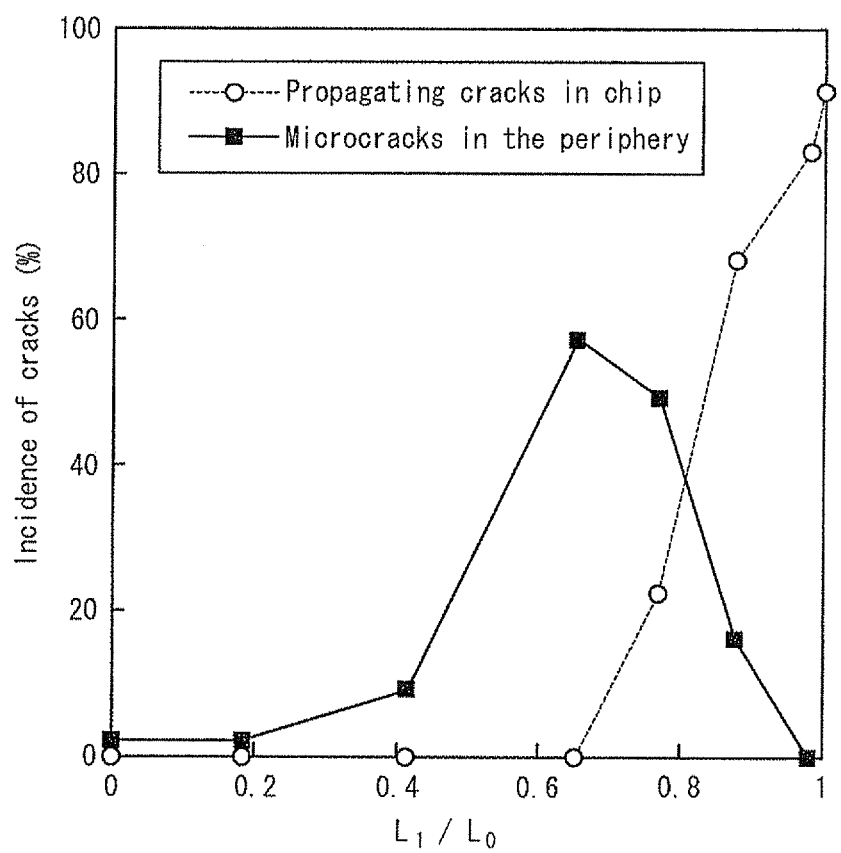
FIG. 7 is a graph showing the incidence of cracks in light emitting structures of LED chips in Experimental Examples 1 to 8.
Figure 8:
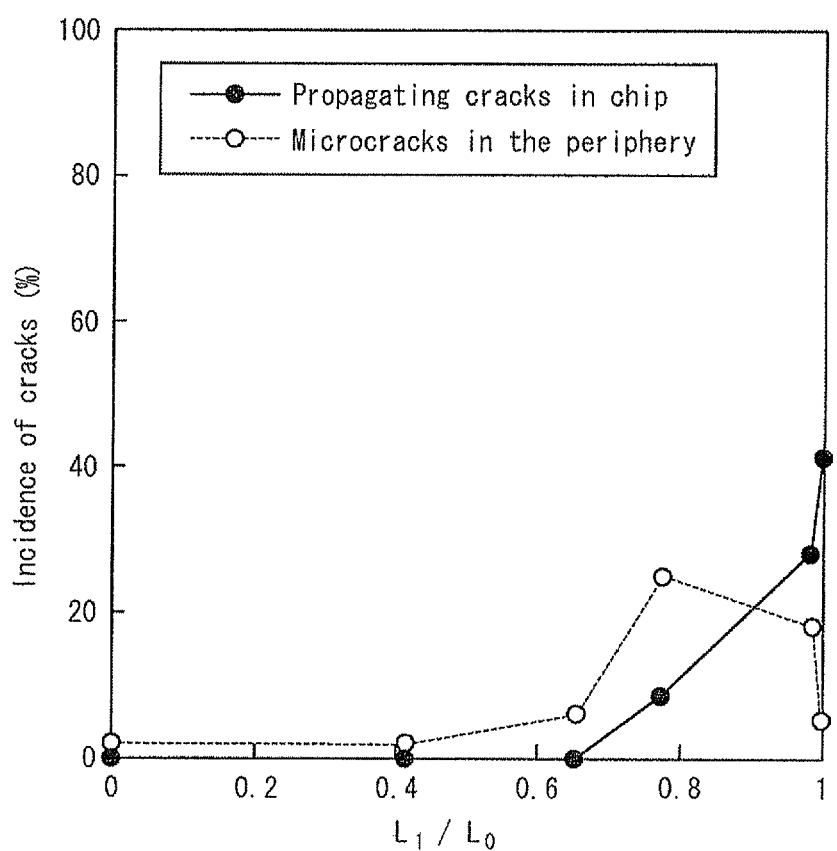
FIG. 8 is a graph showing the incidence of cracks in light emitting structures of LED chips in Experimental Examples 9 to 14.
Figure 9:
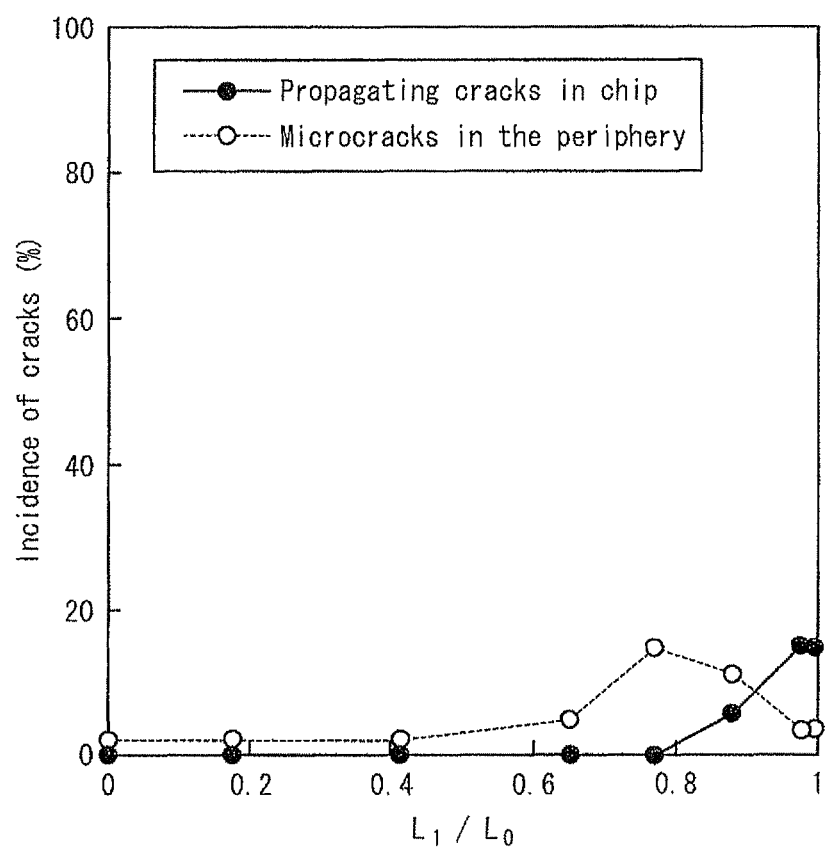
FIG. 9 is a graph showing the incidence of cracks in light emitting structures of LED chips in Experimental Examples 15 to 22.

As shown in Table 1 and FIGS. 7 to 9, in Experimental Examples 2 to 8, 10 to 14, and 16 to 22 in accordance with the present invention, at least either the cracks from the corners toward the center or the cracks along the corners can be suppressed as compared with Experimental Examples 1, 9, and 15 that are comparative examples.

Further, also in Conventional Example and Experimental Examples 23 to 25, the surfaces of light emitting structures exposed by separating the sapphire substrate were observed using an optical microscope, to examine the state of crack formation and crack incidence in the wafer surface. The incidence of the cracks from the corner portions to the chip center and the cracks in the vicinity of the corner portions are also shown in Table 1

The above results show that when the through grooves or the through holes penetrating the conductive support are provided in a portion of the conductive support located between the plurality of light emitting structures, the stress applied to the light emitting structures from the conductive support in the separation of the sapphire substrate was distributed. Further, with respect to the samples in Experimental Examples 23 to 25, the time required for etching the metal layer was 35 hours when the through grooves or holes were not provided. On the other hand, when the through grooves or holes were formed, the time was 6 hours in both cases; thus, not only suppression of crack formation but also great effect in improving productivity was found.

Next, the light emitting structures exposed by separating the sapphire substrate were cleaned. Ti/Al/Ni/Au were formed by vacuum vapor deposition as an n-type ohmic electrode and a wire bonding pad electrode, and the light emitting structures were singulated by cutting using a laser dicer along the cut position shown by the dashed lines in FIG. 5(*a*) and FIG. 6(*a*). The kerf loss was 11 μm to 18 μm. In a case of using a dicing blade, the cutting feed rate cannot be varied at the positions of the through grooves or holes. On the other hand, in the case of using the laser dicer, the penetrating portions which are not required to be cut can be skipped; accordingly, the cutting time was reduced by 50% in the case of forming the through holes at intersection points, and by 60% in the case of forming the through grooves on the grid lines.

Thus, the conductive support portions of LED chips include uncut portions in their side surfaces as shown in the side view of FIG. 5(*b*). The conductive support portion after singulation has a tetragonal top view shape as a basic shape as shown in FIG. 5(*c*). FIG. 6 shows the case of forming the through holes at the intersection points, and the corner portions of the square support substrates are chipped, and the shape of the through holes may be a circular cylinder or a polygonal prism. The top view shape of the conductive support after singulation is an octagon as a basic structure as shown in FIG. 6(*c*). In this case, the light emitting structures also have cut portions and uncut portions in their side surfaces as shown in FIG. 6(*b*). Further, the top view shape of those light emitting structures and the top view shape of those conductive support portions are different, and this structure is preferable in that end faces of the conductive support portions are greater than those of the light emitting structures.

Therefore, as shown in Table 1 and FIGS. 7 to 9, in Experimental Example 2 to 8, 10 to 14, 16 to 22, 24, and 25 in accordance with the present invention, either cracks from the corners toward the center or cracks along the corners can be effectively prevented from forming, as compared with Conventional Example and Experimental Examples 1, 9, 15, and 23 that are comparative examples.

As described above, Experimental Examples 2 to 8, 10 to 14, 16 to 22, 24, and 25 show examples of vertical cross sections of 4n-gons having rounded corners when "n"=1, 2, 3. When "n" is 4 or more, the intersection angle increases. Besides, as the corners are rounded more, the 4n-gon gradually approximates to a circle and can be considered substantially as a circle.

INDUSTRIAL APPLICABILITY

According to the present invention, light emitting structures are formed to have a top view shape of a circle or a 4n-gon ("n" is a positive integer) having rounded corners, and grooves or through holes are provided in a conductive support between a plurality of light emitting structures. Therefore, the stress applied to the light emitting structures from conductive support portions in separation of a sapphire substrate is distributed; thus, high quality vertical LED chips with good yield without cracks in the light emitting structures can be provided.

EXPLANATION OF REFERENCE NUMERALS

100: Vertical LED chip
101: Growth substrate
102: First conductivity type Group III nitride semiconductor layer
103: Light emitting layer
104: Second conductivity type Group III nitride semiconductor layer
105: Light emitting laminate
106: Light emitting structure
107: Conductive support also serving as lower electrode
107a: Conductive support portion
108: Upper electrode
109: Through groove
110: Through hole
111: Groove (etch channel)
200: Vertical LED chip
201: Light emitting structure
202: Conductive support also serving as lower electrode
203: Upper electrode

The invention claimed is:

1. A vertically structured Group III nitride semiconductor LED chip comprising:
a conductive support portion which also serves as a lower electrode;
a connection layer provided on the conductive support portion; and
a light emitting structure including a second conductivity type Group III nitride semiconductor layer provided on the connection layer, a light emitting layer provided on the second conductivity type Group III nitride semiconductor layer, and a first conductivity type Group III nitride semiconductor layer provided on the light emitting layer, the first conductivity type being different from the second conductivity type,
wherein:
the conductive support portion and the light emitting structure are sandwiched between a pair of electrodes,
the light emitting structure has a top view shape of a circle or a 4n-gon ("n" is a positive integer) having rounded corners,
the conductive support portion has a top view larger than and different shape from that of the light emitting structure,
a length of a straight portion in one side of the 4n-gon having rounded corners: $L_1$ satisfies the following formula:

$$L_1 < L0.8_0, \text{ and}$$

$L_0$ is a length of one side of the 4n-gon with the corners not being rounded.

2. The vertically structured Group III nitride semiconductor LED chip according to any one of claim 1, wherein a top view shape of the conductive support portion is an approximately tetragon or octagon shape which is vertically and horizontally symmetrical.

3. A vertically structured Group III nitride semiconductor LED chip comprising:
a conductive support portion which also serves as a lower electrode;
a connection layer provided on the conductive support portion; and
a light emitting structure including a second conductivity type Group III nitride semiconductor layer provided on the connection layer, a light emitting layer provided on the second conductivity type Group III nitride semiconductor layer, and a first conductivity type Group III nitride semiconductor layer provided on the light emitting layer, the first conductivity type being different from the second conductivity type,
wherein:
the conductive support portion and the light emitting structure are sandwiched between a pair of electrodes,
the light emitting structure has a top view shape of a circle or a 4n-gon ("n" is a positive integer) having rounded corners,
part of side surfaces of the conductive support portion has a cut plane and a non-cut plane having a different surface shape from the cut plane, and,
the conductive support portion has a tetragonal top view shape, as a basic structure, and has recesses on four sides, a top of each recess being the cut plane.

4. The vertically structured Group III nitride semiconductor LED chip according to claim 3, wherein the non-cut plane of the side surfaces of the conductive support portion extends to the top and the bottom of the conductive support portion.

* * * * *